US006815812B2

(12) United States Patent
Ali et al.

(10) Patent No.: US 6,815,812 B2
(45) Date of Patent: Nov. 9, 2004

(54) DIRECT ALIGNMENT OF CONTACTS

(75) Inventors: Anwar Ali, San Jose, CA (US); Ken Nguyen, San Jose, CA (US); Max M. Yeung, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 209 days.

(21) Appl. No.: 10/141,252

(22) Filed: May 8, 2002

(65) Prior Publication Data

US 2003/0209797 A1 Nov. 13, 2003

(51) Int. Cl.$^7$ ................................................. H05K 7/06
(52) U.S. Cl. ..................... 257/691; 174/255; 174/262
(58) Field of Search ................................ 361/778, 780, 361/794; 174/262, 255; 257/691, 698

(56) References Cited

U.S. PATENT DOCUMENTS 5,446,243 A * 8/1995 Crowder et al. ............ 174/250
5,939,782 A * 8/1999 Malladi ....................... 257/698
6,657,130 B2 * 12/2003 Van Dyke et al. .......... 174/255

* cited by examiner

*Primary Examiner*—John B. Vigushin
(74) *Attorney, Agent, or Firm*—Luedeka, Neely & Graham, P.C.

(57) ABSTRACT

A packaged circuit with VDDcore contacts in first positions and VSScore contacts in second positions. A redistribution layer is adjacent the integrated circuit, and overlies VDDcore and VSScore mesh layers. First contacts in the redistribution layer are positioned in alignment with the first positions, to make connections between the redistribution layer and the VDDcore contacts. Second contacts are positioned in alignment with the second positions, to make connections between the redistribution layer and the VSScore contacts. First vias are positioned in alignment with the first positions, to make connections between the first contacts and the VDD mesh layer. The traces of the VDD mesh layer are positioned in alignment with the first positions. Second vias are positioned in alignment with the second positions to make connections between the second contacts and the VSS mesh layer. The traces of the VSS mesh layer are positioned in alignment with the second positions.

12 Claims, 3 Drawing Sheets

DIRECT ALIGNMENT OF CONTACTS

FIELD

This invention relates to the field of integrated circuit fabrication. More particularly, this invention relates to integrated circuit packaging.

BACKGROUND

Traditionally, all of the various components of an integrated circuit were powered at a single voltage level. However, in more recent technologies, different components of an integrated circuit are powered from different voltage sources. For example, in some new technologies the core of an integrated circuit, such as the memory or logic components, is powered off of one voltage source, and the input output components of the integrated circuit are powered off of a different voltage source. Typically, the core voltage level, generally designated as VDDcore, is nominally 1.2 volts or less and the input output voltage level, generally designated as VDDio, is nominally 3.3 volts. Each of these two voltage supplies to the integrated circuit also has associated with it a so called ground circuit, which for the core voltage is designated as VSScore and for the input output voltage is designated as VSSio. In addition to these connections to the integrated circuit, connections for the signals to and from the integrated circuit must also be made.

In a flip chip package design, small balls of solder, called bumps, are placed between electrical contacts on the surface of the integrated circuit and electrical contacts on the top most surface of a package substrate. The solder bumps provide the electrical interface between the integrated circuit and the package, which also provides the electrical interface to other components. The top most surface of the package substrate is typically referred to as the redistribution layer. One reason for this is that there are typically so many connections between the integrated circuit and the package substrate, that all of the electrical connections cannot be routed out on a single layer. Thus, the redistribution layer receives electrical connections from the integrated circuit, and redistributes the signals to a plurality of different levels to be routed out.

As the complexity of integrated circuits has increased, or in other words, as the number of devices within an integrated circuit has increased, the number of desired electrical connections to the integrated circuit has also increased. At the same time, the physical size of integrated circuits has decreased. Thus, an ever expanding number of electrical connections must be made within an ever decreasing surface area. This has created problems with finding the physical space in which to form the electrical connections. Adding to this problem is the increase in power and ground connections that is required by having two different voltage levels for the core and the input output components as mentioned above.

Typically, the redistribution layer has bus lines in one or more orthogonal direction, to which the VDDcore and VSScore contacts are electrically connected, and which extend substantially completely across the redistribution layer, at least in those areas which the VDDcore and VSScore contacts are disposed. These bus lines are then dropped down one or two layers through electrical vias to a VDD mesh layer and a VSS mesh layer. One benefit of this design is that the layout of the mesh layers do not need to match the layout of the VDD contacts and VSS contacts on the integrated circuit, because the bus lines on the redistribution layer can be arranged so as to make appropriate connections between the two designs.

However, this design also has problems, in that the signal and other traces must be routed around the bus lines. This tends to severely restrict where the signal traces can go on the redistribution layer, typically resulting in signal traces that are longer, thinner, and more closely spaced together than would otherwise be necessary. All of these conditions tend to increase the resistance capacitance delay of signals carried on the traces.

What is needed, therefore, is an integrated circuit and package design in which VDDcore, VSScore and other electrical connections between the integrated circuit and the package are more efficiently arranged.

SUMMARY

The above and other needs are met by a packaged circuit according to a preferred embodiment of the present invention. An integrated circuit is fabricated with VDDcore contacts in first known positions and VSScore contacts in second known positions. A VDDcore mesh layer is fabricated with traces, and a VSScore mesh layer is fabricated with traces. A redistribution layer is disposed adjacent the integrated circuit, and overlies the VDDcore mesh layer and the VSScore mesh layer.

First contacts in the redistribution layer are positioned in alignment with the first known positions, to make electrical connections between the redistribution layer and the VDDcore contacts. Second contacts are positioned in alignment with the second known positions, to make electrical connections between the redistribution layer and the VSScore contacts.

First electrically conductive vias are positioned in alignment with the first known positions, to make electrical connections between the first contacts and the VDD mesh layer, without using a VDDcore bus that extends substantially across the redistribution layer. The traces of the VDD mesh layer are positioned in alignment with the first known positions. Second electrically conductive vias are positioned in alignment with the second known positions to make electrical connections between the second contacts and the VSS mesh layer, without using a VSScore bus that extends substantially across the redistribution layer. The traces of the VSS mesh layer are positioned in alignment with the second known positions.

By aligning all of the VDDcore contacts on the integrated circuit, the first contacts and the first vias on the redistribution layer, and the traces on the VDD mesh layer, a VDDcore bus that extends substantially across the redistribution layer is not required, and the redistribution layer is freed up for use by the signal and other traces. For example, the signal traces can be more directly routed, wider, and more broadly spaced because a VDDcore bus does not take a substantial portion of the surface area of the redistribution layer. Further, By aligning all of the VSScore contacts on the integrated circuit, the second contacts and the second vias on the redistribution layer, and the traces on the VSS mesh layer, a VSScore bus that extends substantially across the redistribution layer is not required, which frees up addition surface area of the redistribution layer. Thus, a packaged circuit according to a preferred embodiment of the present invention overcomes the problems as mentioned above.

In various preferred embodiments of the invention, the VDD mesh layer and the VSS mesh layer immediately underlie the redistribution layer, while in alternate embodiments intervening layers are disposed between the VDD mesh layer and the VSS mesh layer and the redistribution layer. In one embodiment, at least one of a VDDcore bus and a VSScore bus is disposed on the redistribution layer. However, in this embodiment the bus or buses are limited to no more than about one quarter of the redistribution layer. Such limited size buses can be used in a portion of the integrated circuit that has high VSScore or VDDcore requirements. However, the limited use of the surface area of the redistribution layer for such purposes still allows for the benefits as mentioned above.

According to another aspect of the invention there is provided an integrated circuit package. A VDDcore mesh layer is fabricated with traces, and a VSScore mesh layer is fabricated with traces. A redistribution layer overlies the VDDcore mesh layer and the VSScore mesh layer. The redistribution layer is designed to receive an integrated circuit having VDDcore contacts in first known positions and VSScore contacts in second known positions. First contacts in the redistribution layer are positioned in alignment with the first known positions, to make electrical connections between the redistribution layer and the VDDcore contacts. Second contacts are positioned in alignment with the second known positions, to make electrical connections between the redistribution layer and the VSScore contacts.

First electrically conductive vias are positioned in alignment with the first known positions, to make electrical connections between the first contacts and the VDD mesh layer, without using a VDDcore bus that extends substantially across the redistribution layer. The traces of the VDD mesh layer are positioned in alignment with the first known positions. Second electrically conductive vias are positioned in alignment with the second known positions to make electrical connections between the second contacts and the VSS mesh layer, without using a VSScore bus that extends substantially across the redistribution layer. The traces of the VSS mesh layer are positioned in alignment with the second known positions.

According to yet another aspect of the present invention, there is provided an improved method of making electrical connections between an integrated circuit and a package substrate.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein.

DETAILED DESCRIPTION

Figure 1:
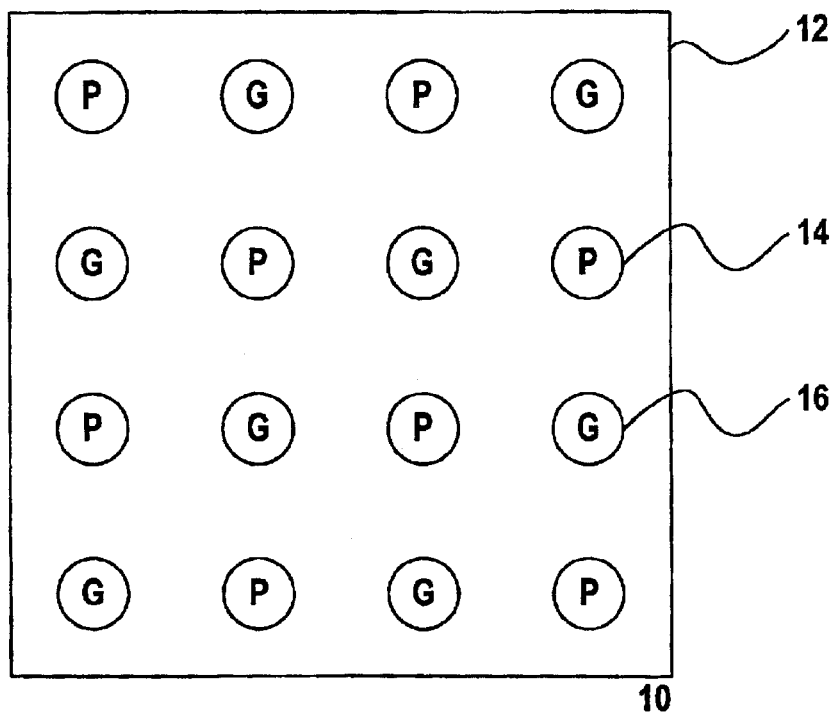
FIG. 1 is a top plan view of an integrated circuit showing VDDcore contacts in first known positions and VSScore contacts in second known positions.

With reference now to FIG. 1, there is depicted a portion of an integrated circuit 10 formed on a substrate 12, with VDDcore contacts 14 and VSScore contacts 16. Most preferably, the integrated circuit 10 is a flip chip. The integrated circuit 10 may perform one or more of a variety of functions, such as analog functions, digital functions, data storage, and logic processing. Most preferably the integrated circuit 10 is a digital application specific integrated circuit that includes a variety of special purpose and general purpose cells.

It is appreciated that this depiction of the integrated circuit 10 is highly representational, and does not depict all of the various elements that are typically included in such an integrated circuit 10, such as is formed on a monolithic silicon substrate 12. For example, none of the VDDio contacts, VSSio contacts, or signal contacts are depicted in the portion of the integrated circuit 10 presented in FIG. 1, so as to better focus attention on the VDDcore contacts 14 and the VSScore contacts 16, which are more pertinent to the described embodiments of the present invention. In actual implementation, there would preferably be a far greater number of VDDcore contacts 14 and VSScore contacts 16 than depicted in FIG. 1, and the arrangement and relative numbers of such VDDcore contacts 14 and VSScore contacts 16 would also be different. However, the depiction as given in FIG. 1 is sufficient to explain the preferred embodiments of the present invention without undue distractions.

As depicted in FIG. 1, the VDDcore contacts 14 are disposed in first known positions and the VSScore contacts 16 are disposed in second known positions. Although there may be functional limitations on where the first known positions and the second known positions are on the substrate 12, these limitations are, for the most part, not imposed by the present invention, but rather by other constraints that are well known to those who design and fabricate such integrated circuits 10, and thus are not discussed further herein. For the sake of the present invention, the primary limitation on the first known positions and the second known positions is that they be known so that other elements of the preferred embodiment as described below can be fabricated to align with the first known positions and the second known positions.

Figure 2:
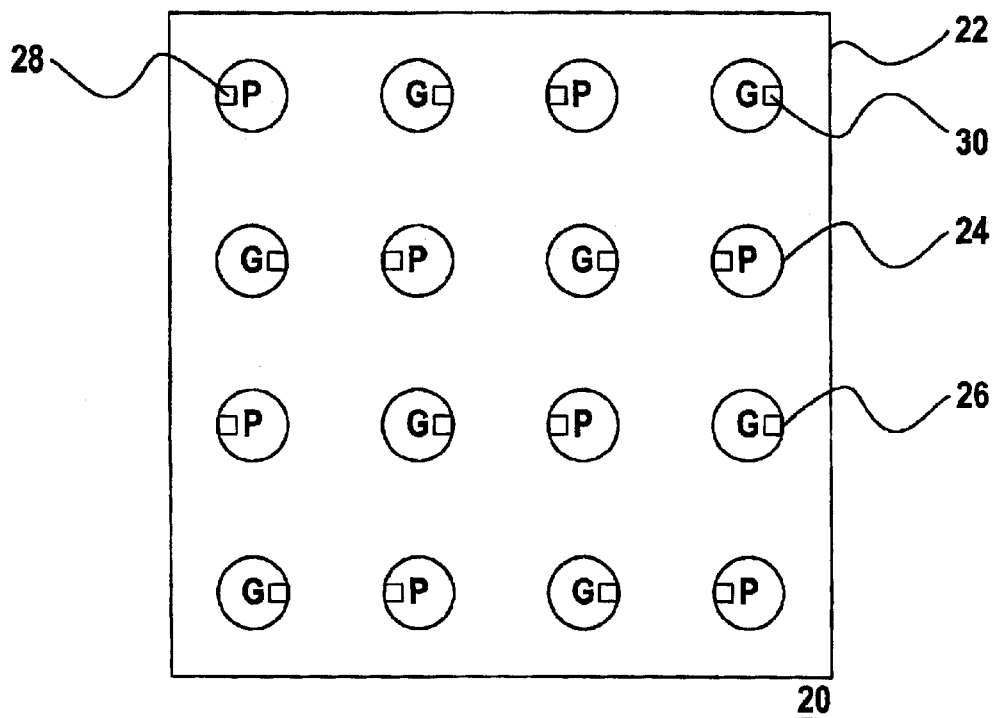
FIG. 2 is a top plan view of a redistribution layer of a package substrate showing first contacts and first electrically conductive vias in alignment with the first known positions, and second contacts and second electrically conductive vias in alignment with the second known positions.

With reference now to FIG. 2, there is depicted a portion of a package 20 with first contacts 24 and second contacts 26 disposed on a substrate 22. The substrate 22 and the package 20 are most preferably of a type that is designed to receive a flip chip integrated circuit 10, make electrical connections with the integrated circuit 10, and route the electrical connections out to electrical contacts on the exterior of the package 20, so as to make electrical connections with external components.

The first contacts 24 are preferably disposed in positions that align with the first positions of the integrated circuit 12 when it is aligned with and bonded to the substrate 22. Similarly, the second contacts 26 are preferably disposed in positions that align with the second positions of the integrated circuit 12 when it is aligned with and bonded to the substrate 22. In other words, when the integrated circuit 12 is flipped over and brought into alignment and contact with the package 20, the VDDcore contacts 14 on the integrated circuit 10 preferably directly overlie and align with the first contacts 24 on the package 20, and the VSScore contacts 16 preferably directly overlie and align with the second contacts 26 on the package 20. Most preferably, solder bumps are used to make electrical connections between the VDDcore contacts 14 and the VSScore contacts 16 on the integrated circuit 10 and the first contacts 24 and the second contacts 26 on the package 20.

Thus, if the integrated circuit 12 of FIG. 1 and the package 20 of FIG. 2 were more accurately depicted, then one or the other of the integrated circuit 12 and the package 20 would be depicted as the mirror image of itself, so that the one could be flipped over and aligned with and attached to the other. However, the integrated circuit 12 and the package 20 are depicted in the manner as presented so that the alignment between the VDDcore contacts 14 and the VSScore contacts 16 on the integrated circuit 10 and the first contacts 24 and the second contacts 26 on the package 20 is more readily seen and understood.

It is appreciated that, similar to that as described above in reference to the integrated circuit 10, the depiction of the package 20 is highly representational, and does not depict all of the various elements that are typically included in such an package 20. For example, none of the contacts associated with the VDDio contacts, VSSio contacts, or signal contacts on the integrated circuit 10 are depicted in the portion of the package 20 presented in FIG. 2, so as to better focus attention on the first contacts 24 and the second contacts 26, which are more pertinent to the described embodiments of the present invention. In actual implementation there would preferably be a far greater number of first contacts 24 and second contacts 26 than depicted in FIG. 2, and the arrangement and relative numbers of such first contacts 24 and second contacts 26 would also be different. However, the depiction as given in FIG. 2 is sufficient to explain the preferred embodiments of the present invention without undue distractions.

As depicted in FIG. 2, the first contacts 24 are disposed in alignment with the first known positions when the integrated circuit 10 is flipped over and brought into alignment with the package 20. Similarly, the second contacts 26 are disposed in alignment with the second known positions when the integrated circuit 10 is flipped over and brought into alignment with the package 20. As mentioned above, although there may be functional limitations on where the first known positions and the second known positions are on the substrate 12 and the substrate 22, these limitations are, for the most part, not imposed by the present invention, but rather by other constraints that are well known to those who design and fabricate such packages 20, and thus are not discussed further herein.

Also depicted in FIG. 2 are first electrically conductive vias 28 and second electrically conductive vias 30. As viewed from the upper surface of an actual package 20, the first electrically conductive vias 28 and the second electrically conductive vias 30 would not be visible, because they underlie the first contacts 24 and the second contacts 26 respectively, and provide electrical connections through the substrate 22 to underlying layers of the substrate 22. For example, the top most layer of the substrate 22 is preferably called the redistribution layer, and the first electrically conductive vias 28 and the second electrically conductive vias 30 provide electrical connections such as to power and ground plane layers that preferably underlie the redistribution layer, as described in more detail below.

Figure 3:
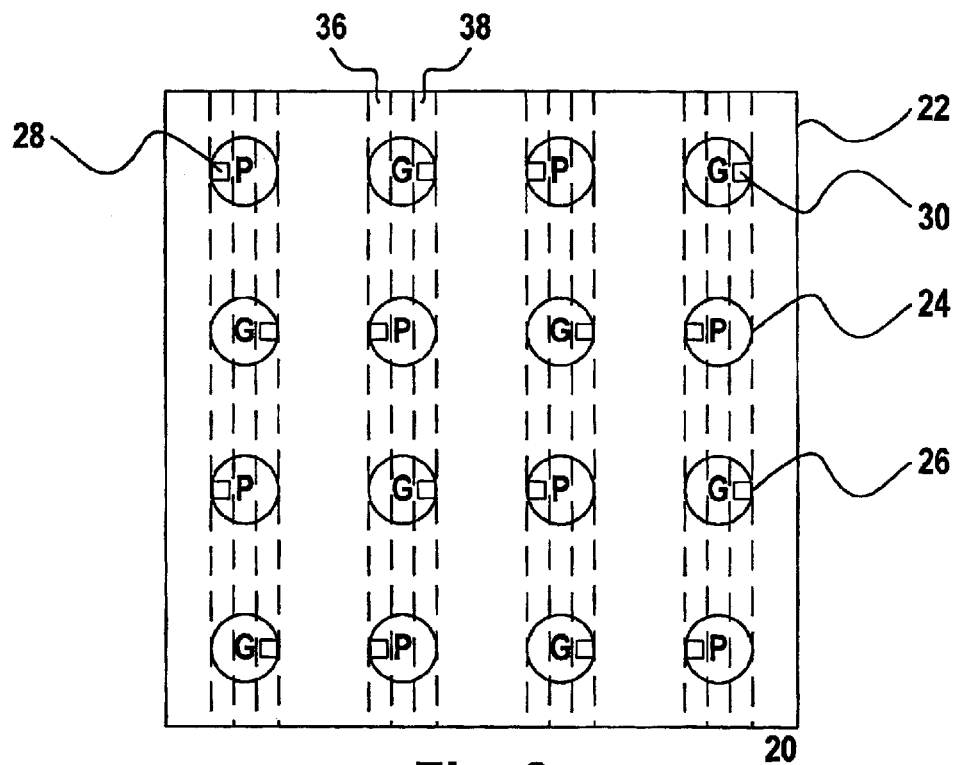
FIG. 3 is a top plan view depicting the alignment of the redistribution layer, the VDD mesh layer, and the VSS mesh layer.

For example, FIG. 3 depicts in phantom a trace 36 of a VDDcore mesh layer that underlies the redistribution layer, where electrical connections between the first contacts 24 and the VDDcore trace 36 is provided by the first electrically conductive vias 28. Similarly, FIG. 3 also depicts in phantom a trace 38 of a VSScore mesh layer that underlies the redistribution layer, where electrical connections between the second contacts 26 and the VSScore trace 38 is provided by the second electrically conductive vias 30.

In the embodiment as depicted in FIG. 3, the traces 36 of the VDD mesh layer are positioned in an alignment with the first known positions of the integrated circuit 10 where they directly underlie the VDDcore contacts 14 of the integrated circuit 10 and the first contacts 24 of the package 20. Similarly, the traces 38 of the VSS mesh layer are positioned in an alignment with the second known positions of the integrated circuit 10 where they directly underlie the VSScore contacts 16 of the integrated circuit 10 and the second contacts 26 of the package 20.

Thus, in the embodiments depicted in FIGS. 2 and 3, there is no VDDcore bus formed on the surface of the redistribution layer of the substrate 22, and there is similarly no VSScore bus formed on the surface of the redistribution layer of the substrate 22. Thus, the surface of the redistribution layer is available for the routing of signal and other traces, which allows such signal traces to be wider, more broadly spaced, and more directly routed and thus shorter, all of which tends to reduce resistance capacitance problems in the packaged integrated circuit according to the present invention.

These benefits are made possible by having the VDDcore contacts 14 on the integrated circuit 10 align with the first contacts 24 and the first electrically conductive vias 28 and the VDD traces 36 on the package 20, and bringing the VDDcore signals directly down to the VDDcore mesh layer without using a VDDcore bus on the redistribution layer of the substrate 22. The benefits are further enabled by similarly having the VSScore contacts 16 on the integrated circuit 10 align with the second contacts 26 and the second electrically conductive vias 30 and the VSS traces 38 on the package 20, and bringing the VSScore signals directly down to the VSScore mesh layer without using a VSScore bus on the redistribution layer of the substrate 22.

Figure 4:
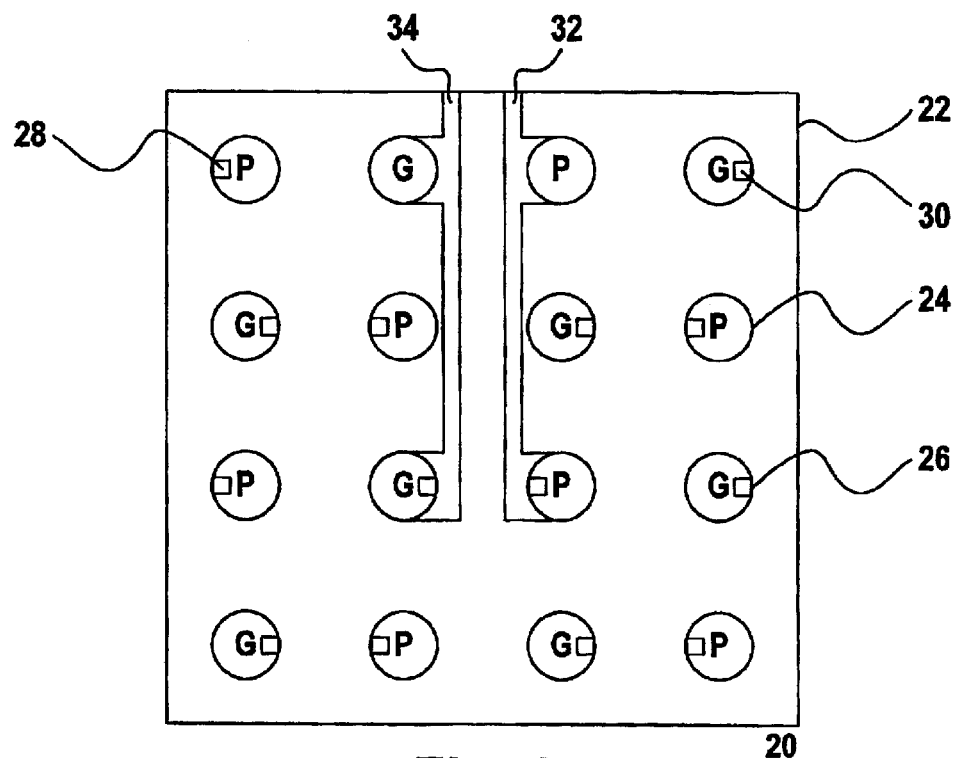
FIG. 4 is top plan view of an alternate embodiment of the redistribution layer, showing a VDDcore bus and a VSScore bus that is limited to a small portion of the surface area of the redistribution layer.

Although such an arrangement provides the greatest benefits in regard to those issues as presented above, benefits can still be realized, although to a somewhat reduced extent, by an embodiment of the present invention such as depicted in FIG. 4, where there is provided a partial VDDcore bus 32 and a partial VSScore bus 34 on the redistribution layer of the substrate 22. As depicted in FIG. 4, the VDDcore bus 32 and the VSScore bus 34 preferably do not extend entirely across the substrate 22, and do not take a significant amount of the surface area of the redistribution layer.

In this manner, there still remains an ample amount of surface area for the routing of signal and other traces on the redistribution layer, and partial benefits of the present invention are still provided. Most preferably, the VDDcore bus 32 and the VSScore bus 34 of this embodiment do not extend through more than about twenty-five percent of the surface area of the redistribution layer. However, this embodiment can provide a good balance between competing benefits for integrated circuits 10 that have a high density of VDDcore and VSScore requirements in a specific portion of the integrated circuit 10.

Figure 5:
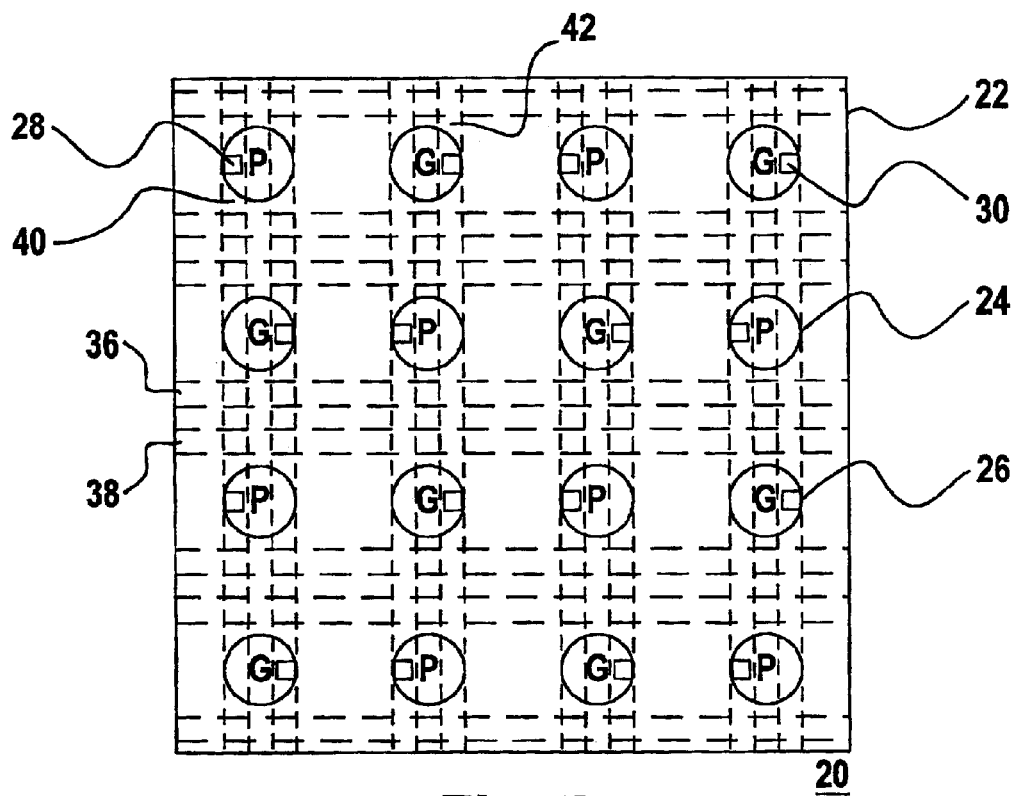
FIG. 5 is a top plan view depicting an alternate alignment of the redistribution layer, the VDD mesh layer, and the VSS mesh layer, with a bus layer.

With reference to FIG. 5, there is depicted an alternate embodiment in which the traces 36 of the VDD mesh layer are positioned in an alignment with the first known positions of the integrated circuit 10 where they do not directly underlie the VDDcore contacts 14 of the integrated circuit 10 and the first contacts 24 of the package 20, but rather are in an alignment where electrical connections are made through the use of a VDDcore bus 40 that is disposed on a layer other than the redistribution layer. Similarly, the traces 38 of the VSS mesh layer are positioned in an alignment with the first known positions of the integrated circuit 10 where they also do not directly underlie the VSScore contacts 16 of the integrated circuit 10 and the second contacts 26 of the package 20, but are also in an alignment where electrical connections are made through the use of a VSScore bus 42 that is disposed on a layer other than the redistribution layer.

Figure 6:
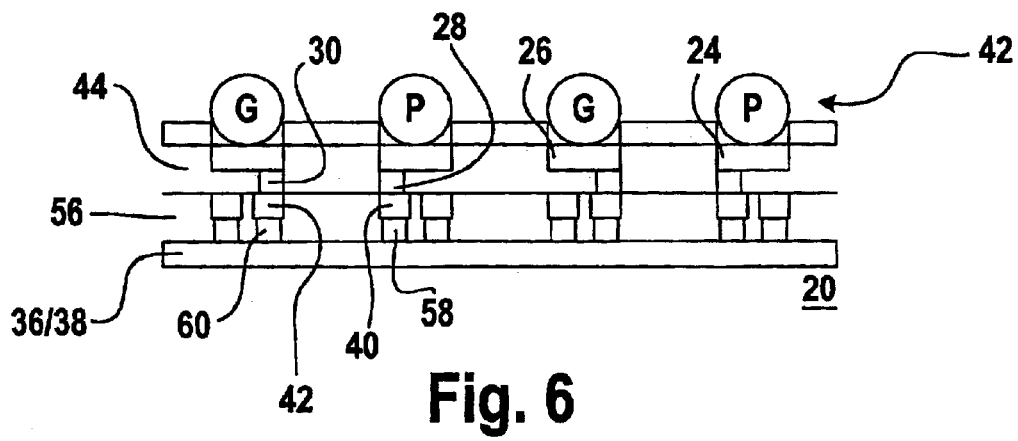
FIG. 6 is a cross sectional view of a package substrate showing a first embodiment of the redistribution layer, the VDD mesh layer, and the VSS mesh layer.

FIG. 6 is cross sectional depiction of the embodiment of FIG. 5, showing solder bumps 42 for making electrical connections between the VDDcore contacts 14 and VSScore contacts 16 of the integrated circuit 10 and the first contacts 24 and the second contacts 26 of the package 20 of the redistribution layer 44, respectively. First electrically conductive vias 28 and second electrically conductive vias 30 then continue the electrical connections to a bus layer 56, where the VDDcore bus lines 40 and the VSScore bus lines 42 are disposed. In this embodiment, the VDDcore bus 40 and the VSScore bus 42 are disposed on the same layer of the substrate 22, but in alternate embodiments the VDDcore bus 40 and the VSScore bus 42 are disposed on separate layers.

Electrically conductive vias 58 and 60 continue the electrical connections to the traces 36 of the VDD mesh layer and the traces 38 of the VSS mesh layer, which is depicted in FIG. 5 as a combined VDD mesh layer and VSS mesh layer. In alternate embodiments the VDD mesh layer and the VSS mesh layer are disposed on separate layers of the substrate 22.

Figure 7:
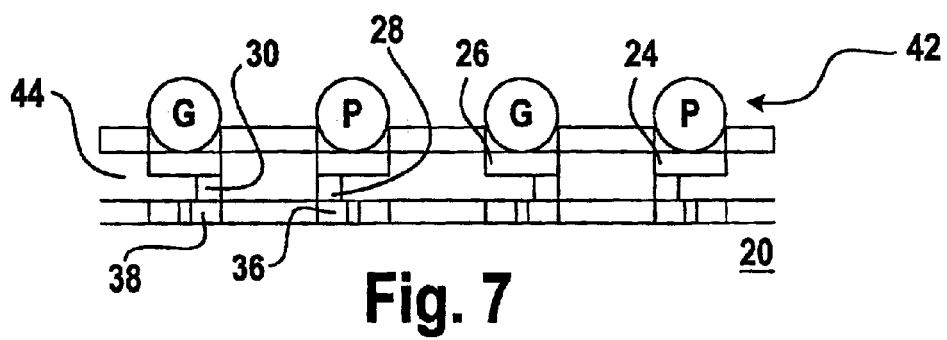
FIG. 7 is a cross sectional view of the package substrate showing a second embodiment of the redistribution layer, the VDD mesh layer, and the VSS mesh layer.

FIG. 7 depicts an embodiment corresponding to FIG. 3 in which the first electrically conductive vias 28 and the second electrically conductive vias 30 make direct electrical connections between the first contacts 24 and the second contacts 26 and the traces 36 of the VDD mesh layer and the traces 38 of the VSS mesh layer respectively, without the use of a VDD bus 40 or a VSS bus 42 on a bus layer 56. The VDD mesh layer and the VSS mesh layer, as depicted in FIG. 7, are a combined VDD mesh layer and VSS mesh layer. In alternate embodiments the VDD mesh layer and the VSS mesh layer are disposed on separate layers of the substrate 22.

Thus, in the embodiments of the present invention as described herein, the surface of the redistribution layer 44 is available for routing signal and other traces, which allows such signal traces to be wider, more broadly spaced, and more directly routed and thus shorter, all of which tends to reduce resistance capacitance problems in the packaged integrated circuit according to the present invention.

The foregoing embodiments of this invention have been presented for purposes of illustration and description. They are not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A packaged circuit, the improvement comprising:
   an integrated circuit having VDDcore contacts in first known positions and VSScore contacts in second known positions,
   a VDDcore mesh layer, the VDDcore mesh layer having traces,
   a VSScore mesh layer, the VSScore mesh layer having traces, and
   a redistribution layer adjacent the integrated circuit and overlying the VDDcore mesh layer and the VSScore mesh layer, the redistribution layer having;
   first contacts positioned in alignment with the first known positions to make electrical connections between the redistribution layer and the VDDcore contacts,
   second contacts positioned in alignment with the second known positions to make electrical connections between the redistribution layer and the VSScore contacts,
   first electrically conductive vias positioned in alignment with the first known positions to make electrical connections between the first contacts and the VDD core mesh layer without using a VDDcore bus that extends substantially across the redistribution layer and any other layer except the VDD core mesh layer, where the traces of the VDDcore mesh layer are positioned in alignment with the first known positions, and
   second electrically conductive vias positioned in alignment with the second known positions to make electrical connections between the second contacts and the VSScore mesh layer without using a VSScore bus that extends substantially across the redistribution layer and any other layer except the VSScore mesh layer, where the traces of the VSScore mesh layer are positioned in alignment with the second known positions.

2. The packaged circuit of claim 1, wherein the VDDcore mesh layer and the VSScore mesh layer immediately underlie the redistribution layer.

3. The packaged circuit of claim 1, wherein intervening layers are disposed between the VDDcore mesh layer and the VSScore mesh layer and the redistribution layer.

4. The packaged circuit of claim 1, wherein the redistribution layer has at least one of a VDDcore bus and a VSScore bus that is limited to no more than about one quarter of the redistribution layer.

5. An integrated circuit package, the improvement comprising:
   a VDDcore mesh layer, the VDDcore mesh layer having traces,
   a VSScore mesh layer, the VSScore mesh layer having traces, and
   a redistribution layer overlying the VDDcore mesh layer and the VSScore mesh layer, the redistribution layer for receiving an integrated circuit adjacent the redistribution layer, the intergrated circuit having VDDcore contacts in first known positions and Vsscore contacts in second known positions, the redistribution layer having:
   first contacts positioned in alignment with the first known positions to make electrical connections between the redistribution layer and the VDDcore contacts, second contacts positioned in alignment with the second known positions to make electrical connections between the redistribution layer and the VSScore contacts, first electrically conductive vias positioned in alignment with the first known positions to make electrical connections between the first contacts and the VDDcore mesh layer without using a VDDcore bus that extends substantially across the redistribution layer and any other layer except the VDDcore mesh layer, where the traces of the VDDcore mesh layer are positioned in alignment with the first known positions, and second electrically conductive vias positioned in alignment with the second known positions to make electrical connections between the second contacts and the VSScore mesh layer without using a VSScore bus that extends substantially across the redistribution layer and any other layer except the VSScore mesh layer, where the traces of the VSScore mesh layer are positioned in alignment with the second known positions.

6. The integrated circuit package of claim 5, wherein the VDDcore mesh layer and the VSScore mesh layer immediately underlie the redistribution layer.

7. The integrated circuit package of claim 5, wherein intervening layers are disposed between the VDDcore mesh layer and the VSScore mesh layer and the redistribution layer.

8. The integrated circuit package of claim 5, wherein the redistribution layer has at least one of a VDDcore bus and a VSScore bus that is limited to no more than about one quarter of the redistribution layer.

9. In an improved method of making electrical connections between an integrated circuit and a package substrate, the improvement comprising the steps of:

fabricating VDDcore contacts in first known positions on the integrated circuit and VSScore contacts in second known positions on the integrated circuit, fabricating a VDDcore mesh layer, the VDDcore mesh layer having traces, fabricating a VSScore mesh layer, the VSScore mesh layer having traces, and fabricating a redistribution layer adjacent the integrated circuit and overlying the VDDcore mesh layer and the VSScore mesh layer, the redistribution layer having:

first contacts positioned in alignment with the first known positions to make electrical connections between the redistribution layer and the VDDcore contacts, second contacts positioned in alignment with the second known positions to make electrical connections between the redistribution layer and the VSScore contacts, first electrically conductive vias positioned in alignment with the first known positions to make electrical connections between the first contacts and the VDDcore mesh layer without using a VDDcore bus that extends substantially across the redistribution layer and any other layer except the VDDcore mesh layer, where the traces of the VDDcore mesh layer are positioned in alignment with the first known positions, and second electrically conductive vias positioned in alignment with the second known positions to make electrical connections between the second contacts and the VSScore mesh layer without using a VSScore bus that extends substantially across the redistribution layer and any other layer except the VSScore mesh layer, where the traces of the VSScore mesh layer are positioned in alignment with the second known positions.

10. The method of claim 9, wherein the VDDcore mesh layer and the VSScore mesh layer immediately underlie the redistribution layer.

11. The method of claim 9, wherein intervening layers are disposed between the VDDcore mesh layer and the VSScore mesh layer and the redistribution layer.

12. The method of claim 9, wherein the redistribution layer has at least one of a VDDcore bus and a VSScore bus that is limited to no more than about one quarter of the redistribution layer.

* * * * *